(12) United States Patent
Park

(10) Patent No.: US 8,003,508 B2
(45) Date of Patent: Aug. 23, 2011

(54) METHOD OF FORMING GATE LINE OF SEMICONDUCTOR DEVICE

(75) Inventor: Chang Ki Park, Busan (KR)

(73) Assignee: Hynix Semiconductor Inc., Incheon-si (KR)

( * ) Notice: Subject to any disclaimer, the term of this patent is extended or adjusted under 35 U.S.C. 154(b) by 145 days.

(21) Appl. No.: 12/479,386

(22) Filed: Jun. 5, 2009

(65) Prior Publication Data

US 2010/0048014 A1     Feb. 25, 2010

(30) Foreign Application Priority Data

Aug. 21, 2008   (KR) .................. 10 2008 0081745

(51) Int. Cl.
*H01L 21/336*    (2006.01)
*H01L 21/3205*   (2006.01)
*H01L 21/4763*   (2006.01)

(52) U.S. Cl. ............. 438/593; 438/257; 257/E21.209; 257/E21.158

(58) Field of Classification Search .......... 438/593, 438/947, 950
See application file for complete search history.

(56) References Cited

U.S. PATENT DOCUMENTS

2003/0189232 A1* 10/2003 Law et al. ............... 257/359
2008/0081412 A1*  4/2008 Jung .................... 438/257

FOREIGN PATENT DOCUMENTS

| KR | 10-2003-0053201 | 6/2003 |
| KR | 10-2003-0059418 | 7/2003 |
| KR | 10-2006-0094707 | 8/2006 |
| KR | 10-2008-0046435 | 5/2008 |

* cited by examiner

*Primary Examiner* — Ha Tran T Nguyen
*Assistant Examiner* — Valerie Brown
(74) *Attorney, Agent, or Firm* — Marshall, Gerstein & Borun LLP

(57) ABSTRACT

A method of forming a gate line of a semiconductor device, wherein when an etch process for forming a gate line is performed, a loading effect is improved, thereby enhancing the operating speed of a semiconductor device. According to a method of forming a gate line of a semiconductor device in accordance with an aspect of the invention, a stack layer is formed over a semiconductor substrate that includes a first area and a second area. Hard mask patterns are formed over the stack layer so that the hard mask patterns are denser in the first area than in the second area. Next, a loading compensation layer is formed before the stack layer is etched, or the loading compensation layer is deposited after the stack layer is partially etched. Accordingly, a loading effect occurring when the stack layer is etched can be offset.

16 Claims, 3 Drawing Sheets

METHOD OF FORMING GATE LINE OF SEMICONDUCTOR DEVICE

CROSS-REFERENCE TO RELATED APPLICATION

Priority to Korean patent application number 10-2008-0081745, filed on Aug. 21, 2008, the entire disclosure of which is incorporated by reference, is claimed.

BACKGROUND OF THE INVENTION

The invention relates to a method of forming a gate line of a semiconductor device and, more particularly, to a method of forming a gate line of a semiconductor device, wherein when an etch process for forming a gate line is performed, a loading effect is improved, thereby enhancing the operating speed of a semiconductor device.

A semiconductor device is divided into a cell array area and a peripheral ("peri") area outside the cell array area. In the case of a NAND flash memory device, a plurality of string structures is repeatedly arranged in the cell array area. Each of the string structures includes a source select transistor, a drain select transistor, and a plurality of memory cells connected in series between the source select transistor and the drain select transistor and configured to store data. Memory cells included in the cell array area and transistors constituting a circuit for driving the select transistors are formed in the peri area.

The memory cells, the select transistors, and the transistors of the peri area are supplied gate signals via gate lines. More specifically, the gate lines include a word line for supplying a gate signal to the memory cell, a select line for supplying a gate signal to the select transistor, and a gate line for supplying a gate signal to the transistor of the peri area. In general, the gate lines in the cell array area are denser than the gate lines in the peri area.

The gate lines are formed by etching a conductive layer for the gate lines, the conductive layer being formed over a semiconductor substrate, using a hard mask pattern as an etch barrier. With ongoing increases in the degree of integration of semiconductor devices, in order to improve the operating speed of a semiconductor device, such as the program speed and the reading speed, by lowering the resistance (Rs) of a gate line, there has been active development of a scheme in which material with low resistivity is stacked over a polysilicon layer as a conductive layer for the gate line. As part of such development, research has been conducted on a scheme for replacing tungsten silicide ($WSi_x$), which formerly was deposited on the polysilicon layer as the conductive layer for the gate lines, as tungsten (W), cobalt silicide ($CoSi_x$) or nickel silicide ($NiSi_x$) with low resistivity. However, tungsten, cobalt silicide, and nickel silicide have low stability as compared with tungsten silicide and require further development, since they have not been verified regarding deposition or etch methods.

Accordingly, there has been continuing development on methods of lowering the resistance of the conductive layer for the gate line using tungsten silicide having secured stability. As a result, a method of increasing the thickness of the tungsten silicide layer has been developed. However, the tungsten silicide layer is problematic in that a loading effect, which is generated according to a density difference of gate lines upon etching since the etch selectivity between the tungsten silicide layer and underlying polysilicon layer is low, becomes severe.

The tungsten silicide layer is also problematic in that the loading effect becomes worse when layer thickness increases. Consequently, when a thick tungsten silicide layer is used, the loading effect becomes severe, which consequently is likely to result in damage to underlying layers.

More specifically, hard mask patterns used to pattern gate lines are formed more densely in the cell array area than in the peri area. If the tungsten silicide layer is etched using the hard mask patterns as an etch barrier, the tungsten silicide layer of the peri area is etched anterior to the tungsten silicide layer of the cell array area and separated on a per-gate-line basis, so an underlying layer is exposed. The layer exposed in the peri area may be damaged during an etch process for separating the tungsten silicide layer of the cell array area on a per-gate-line basis. Consequently, after the tungsten silicide layer is etched, the underlying layers (for example, the polysilicon layer) remain thinner in the peri area than in the cell array area due to the damage of the layer exposed in the peri area.

Accordingly, even while an etch process for separating a layer under the tungsten silicide layer on a per-gate-line basis is performed, the tungsten silicide layer of the peri area is first etched and therefore a layer (a dielectric layer) under the tungsten silicide layer can be exposed and damaged. Furthermore, even an active area provided in the semiconductor substrate of the peri area may be damaged. Damage to the active area causes low reliability of a semiconductor device. Accordingly, there is a need for a scheme, which can increase the thickness of the tungsten silicide layer by improving the loading effect.

BRIEF SUMMARY OF THE INVENTION

The invention is directed to a method of forming a gate line of a semiconductor device, which can enhance the operating speed of a semiconductor device by improving the loading effect during an etch process for forming gate lines.

A method of forming a gate line of a semiconductor device according to an aspect of the invention includes forming a stack layer over a semiconductor substrate including a first area and a second area, forming hard mask patterns over the stack layer so that the hard mask patterns are denser in the first area than in the second area, forming a loading compensation layer that is thicker in the second area than in the first area on a surface of the stack layer including a surface of the hard mask patterns, and separating the stack layer on a per-gate-line basis by etching the loading compensation layer formed on the surface of the stack layer and the stack layer.

The stack layer preferably comprises a first polysilicon layer, a dielectric layer, a second polysilicon layer, and a tungsten silicide layer, with a gate insulating layer formed on the semiconductor substrate between the semiconductor substrate and the first polysilicon layer.

The gate insulating layer and the first polysilicon layer preferably are formed on an active area of the semiconductor substrate, and isolation layers preferably are formed in an isolation area of the semiconductor substrate.

The formation of the loading compensation layer and the etching of the stack layer preferably are performed using an in-situ method within the same equipment.

A method of forming a gate line of a semiconductor device according to another aspect of the invention includes forming a stack layer over a semiconductor substrate including a first area and a second area, forming hard mask patterns over the stack layer so that the hard mask patterns are denser in the first area than in the second area, etching a top surface of the stack layer such that a surface of the stack layer that does not overlap with the hard mask patterns is lower than a surface of the stack layer that overlaps with the hard mask patterns, forming a loading compensation layer that is thicker in the second area than in the first area, on the etched surface of the stack layer including a surface of the hard mask patterns, and separating the stack layer on a per-gate-line basis by etching the loading compensation layer formed on the surface of the stack layer and the stack layer.

The stack layer preferably comprises a first polysilicon layer, a dielectric layer, a second polysilicon layer, and a tungsten silicide layer, with a gate insulating layer formed on the semiconductor substrate and disposed between the semiconductor substrate and the first polysilicon layer.

The gate insulating layer and the first polysilicon layer preferably are formed on an active area of the semiconductor substrate, and isolation layers preferably are formed in an isolation area of the semiconductor substrate.

In the etching of the top surface of the stack layer, the tungsten silicide layer preferably is separated on a per-gate-line basis by etching the tungsten silicide layer.

In the etching of the top surface of the stack layer, the tungsten silicide layer preferably is etched such that a surface of the tungsten silicide layer that does not overlap with the hard mask patterns is lower than a surface of the tungsten silicide layer that overlaps with the hard mask patterns.

The etching of the top surface of the stack layer, the formation of the loading compensation layer, and the etching of the stack layer preferably are performed using an in-situ method in the same equipment.

The loading compensation layer preferably is formed using a deposition gas.

The loading compensation layer preferably is formed of a silicon oxide layer.

The silicon oxide layer preferably is formed using a gas selected from the group consisting of a mixed gas of $SiCl_4$ gas and $O_2$ gas, a mixed gas of $SiH_2Cl_2$ gas and $2N_2O$ gas, a mixed gas of $SiH_4$ gas and $2N_2O$ gas, and $Si(OC_2H_5)_4$ gas.

DESCRIPTION OF SPECIFIC EMBODIMENT

Specific embodiments according to the invention are described below with reference to the accompanying drawings.

Figure 1A:
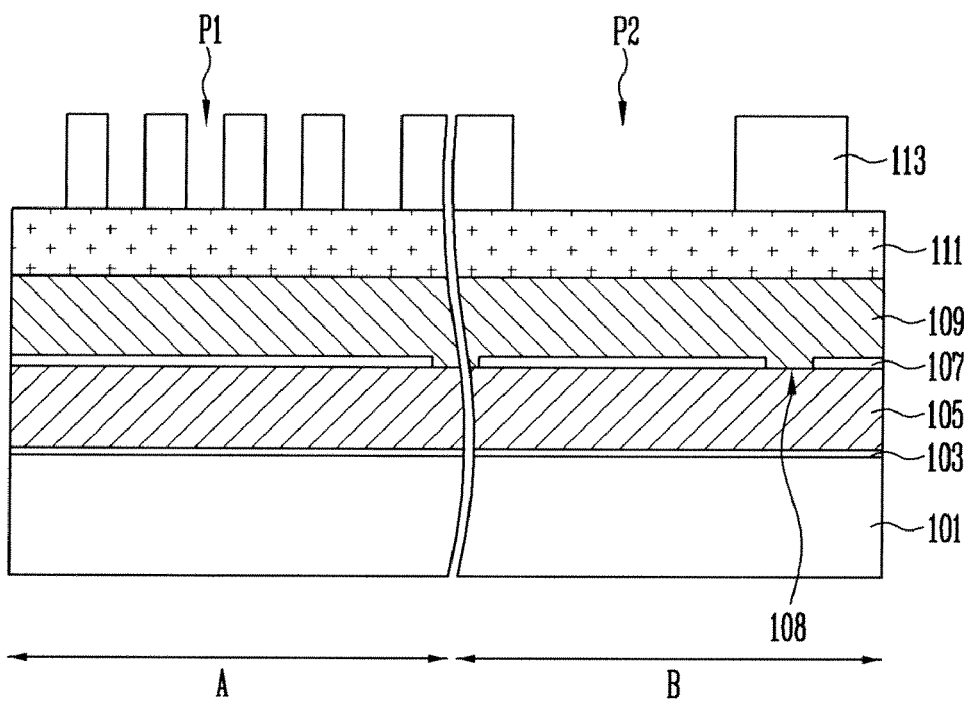
FIGS. 1A to 1C are sectional views illustrating a method of forming a gate line of a semiconductor device in accordance with a first embodiment of the invention.
Figure 1B:
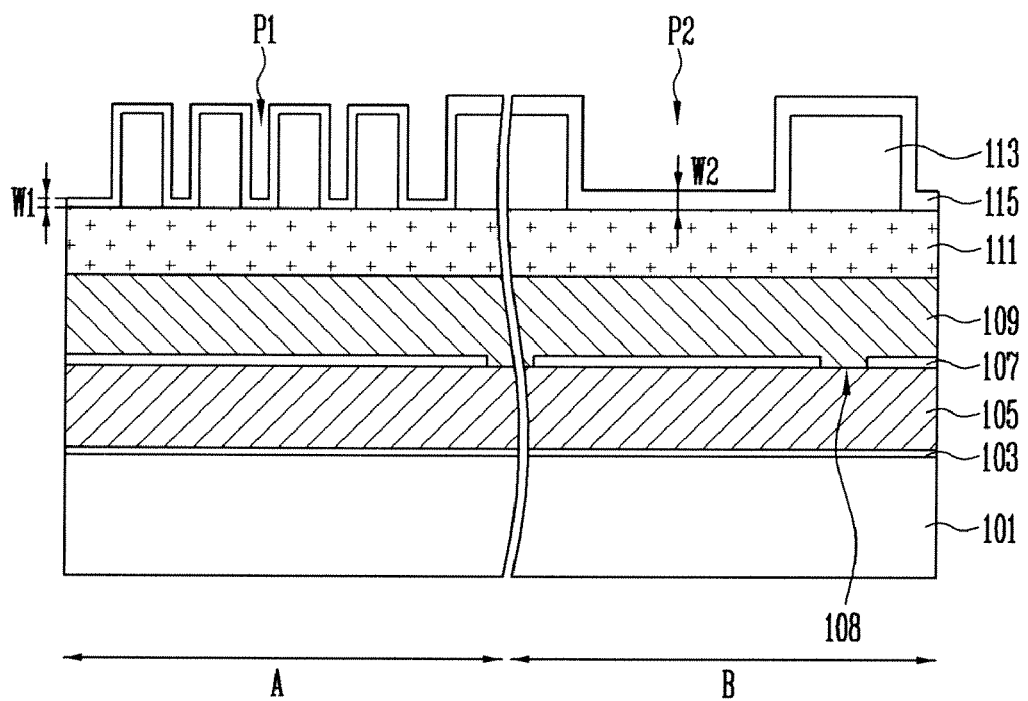
Figure 1C:
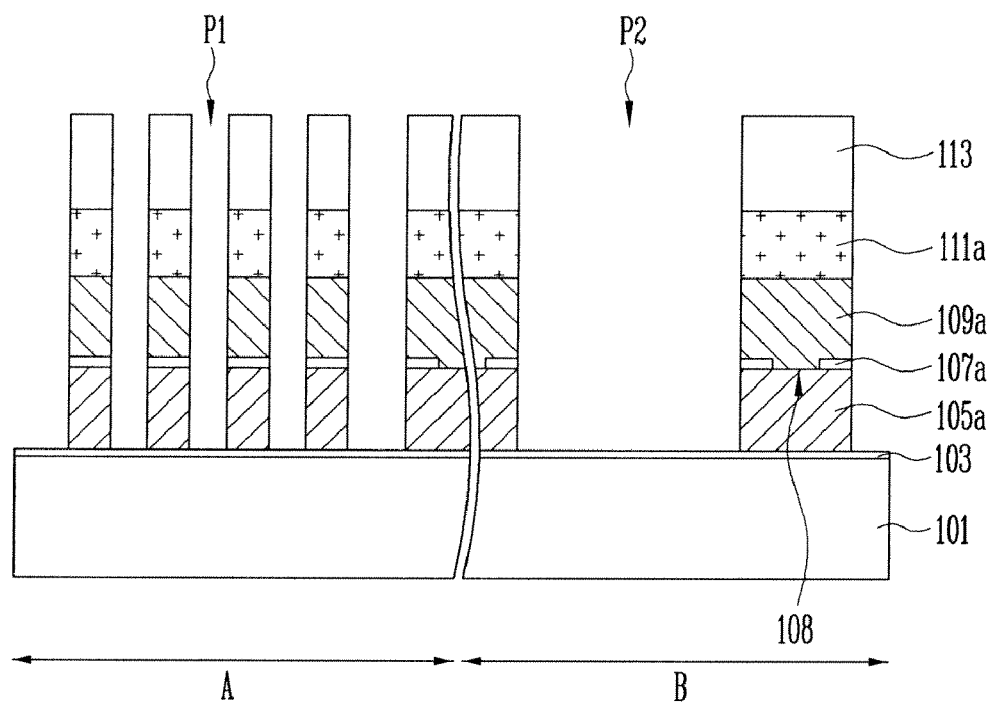

FIGS. 1A to 1C are sectional views illustrating a method of forming a gate line of a semiconductor device in accordance with a first embodiment of the invention. FIGS. 1A to 1C are sectional views of a semiconductor substrate taken along the direction of gate lines. A flash device is hereinafter described as an example.

Referring to FIG. 1A, a gate insulating layer 103, a first conductive layer 105 for a floating gate, a dielectric layer 107, a second conductive layer 109 for a control gate, and a third conductive layer 111 for lowering resistance of the control gate are formed over a semiconductor substrate 101 in which a well (not shown) is formed and on which an ion implantation process for controlling the threshold voltage has been performed. Gate hard mask patterns 113 are formed on the third conductive layer 111.

The semiconductor substrate 101 includes a first area A and a second area B. Gate lines to be formed in a subsequent process are formed more densely in the first area A than in the second area B. For example, the first area A may become a cell array area where memory cells and select transistors will be formed, and the second area B may become a peri area outside the cell array area. The gate insulating layer 103 preferably is formed of an oxide layer. The first conductive layer 105 preferably is formed of a polysilicon layer. For example, the first conductive layer 105 preferably is formed of a doped polysilicon layer or a stack of a doped polysilicon layer and an undoped polysilicon layer. The dielectric layer 107 preferably is formed by stacking an oxide layer, a nitride layer, and an oxide layer. After the dielectric layer 107 is formed, a dielectric layer contact hole 108 is formed over an area of select lines and the gate lines of the peri area. The dielectric layer contact hole 108 preferably becomes a hole that electrically connects the first conductive layer 105 and the second conductive layer 109. The second conductive layer 109 preferably comprises a polysilicon layer, and the third conductive layer 111 preferably comprises tungsten silicide ($WSi_x$).

Figure 2:
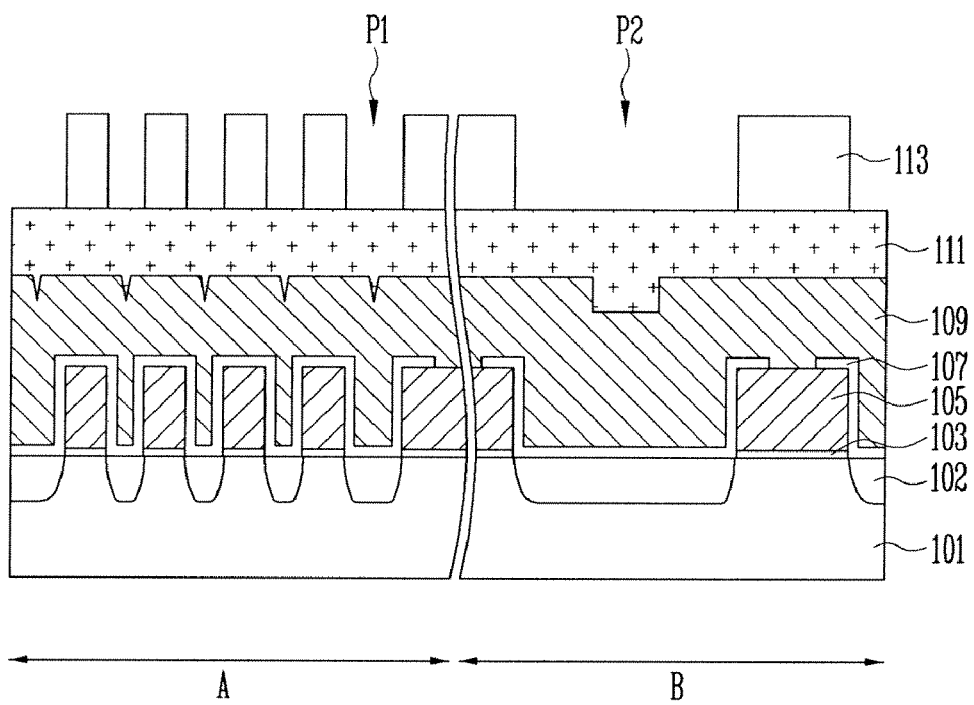
FIG. 2 is a sectional view of a semiconductor substrate taken along a direction different from that in FIG. 1A.

FIG. 2 is a sectional view of the semiconductor substrate taken along a string direction that is different from the direction of FIG. 1A. Referring to FIG. 2, isolation layers 102 are formed in the semiconductor substrate 101. For example, the isolation layers preferably are formed by forming the first conductive layer 105, forming trenches in the first conductive layer 105 and gap-filling the trenches with an oxide layer. When the trenches are formed, portions of the first conductive layer 105 can be separated from each other with an area in which the trenches will be formed so as to intervene between the separated portions of the first conductive layer. The active areas of the semiconductor substrate 101 are also separated from each other with the isolation layer 102 intervening between the separated active areas of the semiconductor substrate.

The gate hard mask patterns 113 preferably are formed of a nitride layer or an oxide layer or a stack of a nitride layer and an oxide layer. The gate hard mask patterns 113 are formed more densely in the first area A than in the second area B. Accordingly, a first aperture P1 between the gate hard mask patterns 113 formed in the first area A has an aspect ratio (in this case, the ratio of height to width) greater than that of a second aperture P2 between the gate hard mask patterns 113 formed in the second area B.

Referring to FIG. 1B, a loading compensation layer 115 is formed on a surface of the third conductive layer 111, including a surface of the gate hard mask patterns 113.

The method of depositing the loading compensation layer 115 is aspect ratio dependent (ARD). That is, the loading compensation layer 115 is deposited by employing a characteristic wherein the aspect ratio of the first aperture P1 is greater than that of the second aperture P2. The aspect ratio of the first aperture P1 is greater than that of the second aperture P2, and a surface area of the second area P2 in which the second aperture P2 is formed is narrower than that of the first area P1 in which the first aperture P1 is formed. Accordingly, when the loading compensation layer 115 is deposited using a deposition method dependent on the aspect ratio, the loading compensation layer 115 is more thickly deposited in the second area P2 having a surface area narrower than that of the first area P1 (W1<W2). For example, the loading compensation layer 115 preferably is formed by depositing a silicon oxide ($SiO_2$) layer using a deposition gas (e.g., a mixed gas of $SiCl_4$ gas and $O_2$ gas, a mixed gas of $SiH_2Cl_2$ gas and $2N_2O$ gas, a mixed gas of SiH$_4$ gas and 2N$_2$O gas, or a Si(OC$_2$H$_5$)$_4$ gas) listed in chemical formulas 1 to 4, below.

$$SiCl_4 + O_2 \rightarrow SiO_2 + 2Cl_2 \quad \text{[Chemical Formula 1]}$$

$$SiH_2Cl_2 + 2N_2O \rightarrow SiO_2 + 2N_2 + 2HCl \text{(reaction temperature: 780 degrees Celsius to 900 degrees Celsius)} \quad \text{[Chemical Formula 2]}$$

$$SiH_4 + 2N_2O \rightarrow SiO_2 + 2N_2 + 2H_2 \text{(reaction temperature: 750 degrees Celsius to 800 degrees Celsius)} \quad \text{[Chemical Formula 3]}$$

$$Si(OC_2H_5)_4 \rightarrow SiO_2 + 4C_2H_4 + 2H_2O \text{(reaction temperature: 650 degrees Celsius to 800 degrees Celsius)} \quad \text{[Chemical Formula 4]}$$

As described above, in the case in which the loading compensation layer 115 is deposited using a deposition method employing a deposition gas, an etch apparatus used in a subsequent etch process can be utilized without introducing additional equipment (in other words, deposition of the loading compensation layer and etching in a subsequent process may be performed in the same apparatus).

More specifically, when depositing the loading compensation layer 115 using an etch apparatus, the deposition gases listed in the chemical formulas 1 to 4 may be injected into the etch apparatus without applying a bias power to the etch apparatus. If this method is employed, the loading compensation layer 115, such as a silicon oxide layer, can be deposited within the etch apparatus, enabling the deposition process of the loading compensation layer 115 and a subsequent etch process to be performed in-situ. Accordingly, an increase in production cost can be prevented.

Referring to FIG. 1C, the loading compensation layer 115 and the third conductive layer 111 shown in FIG. 1B are etched, thereby forming third conductive patterns 111a below the gate hard mask patterns 113 such that the third conductive patterns 111a are separated from each other on a per-gate-line basis. Here, a loading effect according to a density difference of gate lines, which should be formed in the first area A and the second area B, is offset by the loading compensation layer 115 formed with a different thickness on a per area basis as described above with reference to FIG. 1B.

Accordingly, the third conductive patterns 111a preferably are formed in the first and second areas A, B, respectively, without a loading effect. Consequently, damage to the second conductive layer (refer to 109 of FIG. 1B) under the third conductive patterns 111a in the second area B can be prevented, so the second conductive layer (refer to 109 of FIG. 1B) can maintain the same thickness in the first and second areas A, B. Thereafter, although the second conductive layer (refer to 109 of FIG. 1B) is etched so that the second conductive patterns 109a are separated from each other on a per-gate-line basis, the dielectric layer (refer to 107 of FIG. 1B) can be prevented from being over etched in the second area B.

As described above, when the second conductive patterns 109a are formed, the dielectric layer (refer to 107 of FIG. 1B) is prevented from being over etched in the second area B. Thus, dielectric patterns 107a may remain on the sidewalls of the first conductive layer (refer to 105 of FIG. 2) formed in the second area B. Accordingly, although first conductive patterns 105a separated from each other on a per-gate-line basis are formed by etching the first conductive layer (refer to 105 of FIG. 1B) in a subsequent process, the active area of the semiconductor substrate 101 can be protected through the dielectric patterns 107a remaining on the sidewalls of the first conductive layer (refer to 105 of FIG. 2), so that damage to the active area can be prevented.

Figure 3A:
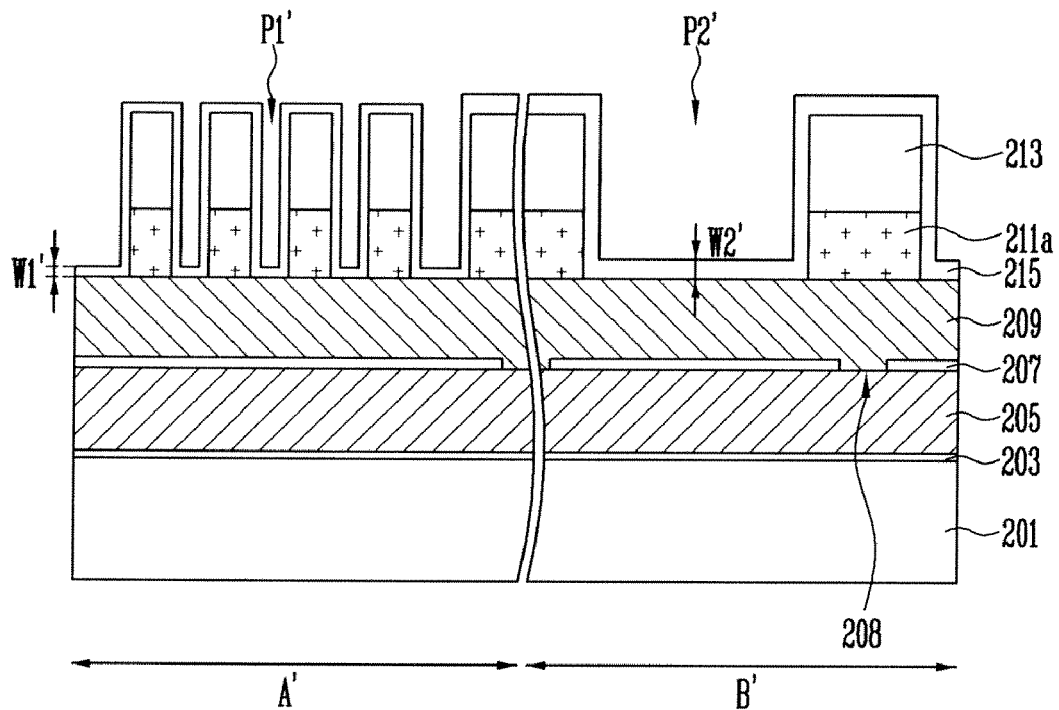
FIGS. 3A and 3B are sectional views illustrating a method of forming a gate line of a semiconductor device in accordance with a second embodiment of the invention.
Figure 3B:
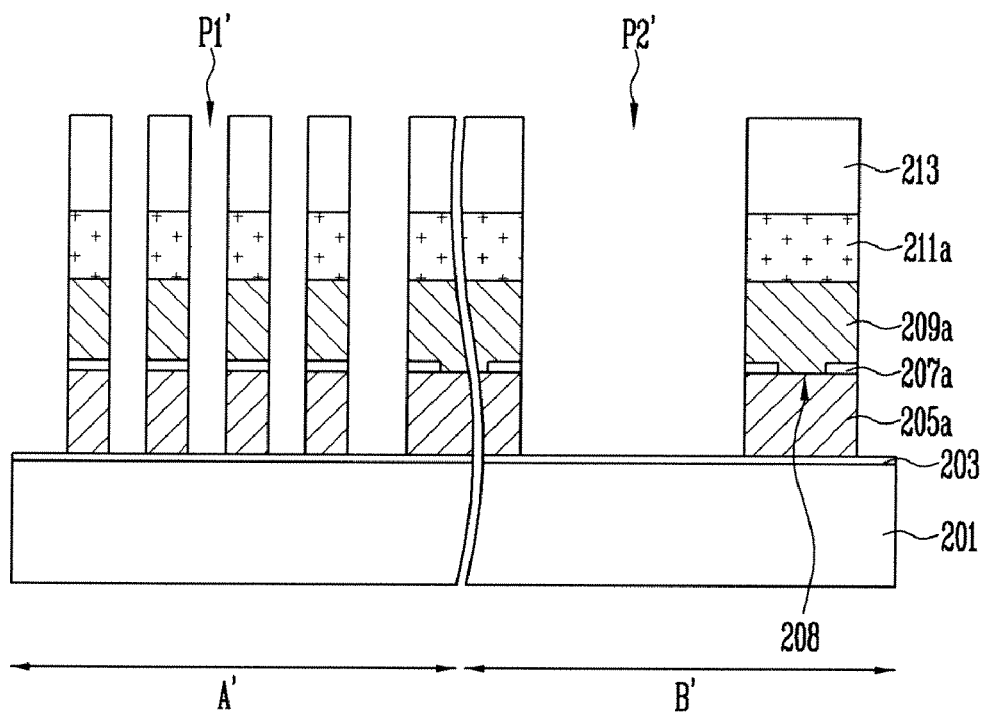

FIGS. 3A and 3B are sectional views illustrating a method of forming a gate line of a semiconductor device in accordance with a second embodiment of the invention. The second embodiment of the invention shown in FIGS. 3A and 3B is identical to the first embodiment shown in FIGS. 1A to 1C and FIG. 2 except that a loading compensation layer 215 is formed before a second conductive layer 209 is etched (i.e., after third conductive patterns are formed), and redundant description thereof will be omitted herein.

Referring to FIG. 3A, in the second embodiment of the invention, in the same manner as the first embodiment of the invention described with reference to FIG. 1A, a gate insulating layer 203, a first conductive layer 205, a dielectric layer 207, a third conductive layer, and a hard mask pattern 213 are deposited over a semiconductor substrate 201. Third conductive patterns 211a are formed under gate hard mask patterns 213 by etching the third conductive layer as an etch barrier. In the second embodiment of the invention, unlike the first embodiment of the invention, the third conductive patterns 211a are formed and the loading compensation layer 215 is then formed. The loading compensation layer 215 is formed using a deposition method depending on the aspect ratio as described above with reference to FIG. 1B. Accordingly, the loading compensation layer 215 is formed thickly in a second area B' than in a first area A' (W2'>W1'). Consequently, although the thickness of the second conductive layer 209 remaining in the second area B' is relatively thin due to the loss of the second conductive layer 209 of the second area B by a loading effect when the third conductive patterns 211a are formed, a difference in the thickness is compensated for by the loading compensation layer 215.

Referring to FIG. 3B, the loading compensation layer 215 and the second conductive layer 209 shown in FIG. 3A are etched to thereby form second conductive patterns 209a under the third conductive patterns 211a with the second conductive patterns 209a being separated from each other on a per-gate-line basis. Here, a difference in the thickness of the second conductive layer 209 etched in the first area A' and the second area B' is offset by the loading compensation layer 215 described with reference to FIG. 3A. Accordingly, although an etch process is performed such that the second conductive patterns 209a are separated from each other on a per-gate-line basis, over-etch of the dielectric layer (refer to 207 of FIG. 3A) in the second area B' can be prevented. As described above, over-etch of the dielectric layer (refer to 207 of FIG. 3A) in the second area B' is prevented when the second conductive patterns 209a are formed. Thus, in the same manner as the first embodiment of the invention, dielectric patterns 207a can remain on the sidewalls of the first conductive layer 205 formed in the second area B'. Accordingly, although the first conductive patterns 205a that are separated from each other on a per-gate-line basis are formed by etching the first conductive layer (refer to 205 of FIG. 3A) in a subsequent process, the dielectric patterns 207a remaining on the sidewalls of the first conductive layer can protect the active area of the semiconductor substrate 201. Consequently, damage to the active area can be prevented.

In the first and second embodiments, in addition to the methods described above, the loading compensation layer may be formed after a top surface of the third conductive layer is etched so that a surface of the third conductive layer that does not overlap with the hard mask patterns is lower than a surface of the third conductive layer that overlaps with the hard mask pattern. That is, the loading compensation layer may be formed before the third conductive patterns are formed. The respective etch process preferably is performed within the same etch apparatus. The loading compensation layer preferably is formed using an in-situ method by injecting gas for depositing the loading compensation layer into an etch apparatus in the same manner as the first embodiment of the invention. The effects obtained by the loading compensation layer can be maximized when a tungsten silicide layer is used as the third conductive layer. However, the invention is not limited to the case in which the tungsten silicide layer is used as the third conductive layer, but may be applied to a case in which a cobalt silicide layer, etc. is used as the third conductive layer.

As described above, according to the invention, the loading compensation layer is first formed, and the second conductive layer formed on the dielectric layer is then etched. Accordingly, a loading effect caused when the third conductive layer is etched can be offset. Accordingly, the invention can prevent the active area of the semiconductor substrate from being damaged by the loading effect.

According to the invention, the loading compensation layer is formed using a deposition method dependent on the aspect ratio. Thus, a loading effect can be offset when an etch process is carried out. Accordingly, the invention can increase the thickness of a tungsten silicide layer used in a conductive layer for a gate line, so that resistance (Rs) of the gate line can be improved and the operating speed of a semiconductor device can be enhanced.

Further, according to the invention, a loading effect according to a density difference of patterns at the time of an etch process can be improved. Accordingly, margin of an etch process can be secured, and the occurrence of failure, such as damage of an active area of a semiconductor substrate, can be prohibited. Consequently, the invention can improve the reliability and yield of semiconductor devices and save production cost.

The embodiment disclosed herein has been proposed to allow a person skilled in the art to easily implement the invention, and the person skilled in the part may implement the invention in various ways. Therefore, the scope of the invention is not limited by or to the embodiments as described above, and should be construed to be defined only by the appended claims and their equivalents.

What is claimed is:

1. A method of forming a gate line of a semiconductor device, the method comprising:
   forming a stack layer over first and second areas of a semiconductor substrate;
   forming hard mask patterns over the stack layer over the first and second areas so that the hard mask patterns are denser in the first area than in the second area;
   forming a loading compensation layer along a surface of the stack layer and a surface of the hard mask patterns over the first and second areas, the loading compensation layer being thicker in the second area than in the first area; and
   forming a gate line by removing all of the loading compensation layer and the stack layer between the hard mask patterns,
   wherein the loading compensation layer being thicker in the second area than in the first area is used to reduce a loading effect during the removing process to form the gate line.

2. The method of claim 1, wherein the stack layer comprises a first polysilicon layer, a dielectric layer, a second polysilicon layer, and a tungsten silicide layer with a gate insulating layer formed on the semiconductor substrate and disposed between the first polysilicon layer and the semiconductor substrate.

3. The method of claim 2, comprising forming the gate insulating layer and the first polysilicon layer on an active area of the semiconductor substrate, and forming isolation layers in an isolation area of the semiconductor substrate.

4. The method of claim 1, comprising forming the loading compensation layer and performing the removing process to form the gate line using an in-situ method within the same equipment.

5. The method of claim 1, comprising forming the loading compensation layer using a deposition gas.

6. The method of claim 1, wherein the loading compensation layer comprises a silicon oxide layer.

7. The method of claim 6, comprising forming the silicon oxide layer using a gas selected from the group consisting of a mixed gas of $SiCl_4$ gas and $O_2$ gas, a mixed gas of $SiH_2Cl_2$ gas and $2N_2O$ gas, a mixed gas of $SiH_4$ gas and $2N_2O$ gas, and $Si(OC_2H_5)_4$ gas.

8. A method of forming a gate line of a semiconductor device, the method comprising:
   forming a stack layer over first and second areas of a semiconductor substrate;
   forming hard mask patterns over the stack layer over the first and second areas so that the hard mask patterns are denser in the first area than in the second area;
   etching a top surface of the stack layer such that a surface of the stack layer that does not overlap with the hard mask patterns is lower than a surface of the stack layer that overlaps with the hard mask patterns;
   forming a loading compensation layer along the etched surface of the stack layer and a surface of the hard mask patterns over the first and second areas, the loading compensation layer being thicker in the second area than in the first area; and
   forming a gate line by removing all of the loading compensation layer and the stack layer between the hard mask patterns,
   wherein the loading compensation layer being thicker in the second area than in the first area is used to reduce a loading effect during the removing process to form the gate line.

9. The method of claim 8, wherein the stack layer comprises a first polysilicon layer, a dielectric layer, a second polysilicon layer, and a tungsten silicide layer, with a gate insulating layer formed on the semiconductor substrate and disposed between the semiconductor substrate and the first polysilicon layer.

10. The method of claim 9, comprising forming the gate insulating layer and the first polysilicon layer on an active area of the semiconductor substrate, and forming isolation layers in an isolation area of the semiconductor substrate.

11. The method of claim 9, comprising, in etching the top surface of the stack layer, etching the tungsten silicide layer to remove the tungsten silicide layer between the hard mask patterns.

12. The method of claim 9, comprising, in etching the top surface of the stack layer, etching the tungsten silicide layer such that the surface of the tungsten silicide layer that does not overlap with the hard mask patterns is lower than a surface of the tungsten silicide layer that overlaps with the hard mask patterns.

13. The method of claim 8, comprising etching the top surface of the stack layer, forming the loading compensation layer, and performing the removing process to form the gate line using an in-situ method in the same equipment.

14. The method of claim 8, comprising forming the loading compensation layer using a deposition gas.

15. The method of claim 8, wherein the loading compensation layer comprises a silicon oxide layer.

16. The method of claim 15, comprising forming the silicon oxide layer using a gas selected from the group consisting of a mixed gas of $SiCl_4$ gas and $O_2$ gas, a mixed gas of $SiH_2Cl_2$ gas and $2N_2O$ gas, a mixed gas of $SiH_4$ gas and $2N_2O$ gas, and $Si(OC_2H_5)_4$ gas.

* * * * *